United States Patent

Toya et al.

[11] Patent Number: 5,074,017
[45] Date of Patent: Dec. 24, 1991

[54] SUSCEPTOR

[75] Inventors: Eiichi Toya; Yukio Itoh; Tadashi Ohashi; Masayuki Sumiya; Yasumi Sasaki, all of Oguni, Japan

[73] Assignee: Toshiba Ceramics Co., Ltd., Japan

[21] Appl. No.: 454,782

[22] Filed: Dec. 26, 1989

[30] Foreign Application Priority Data

Jan. 13, 1989 [JP] Japan ................................. 1-4835

[51] Int. Cl.⁵ ............................................. C23C 16/00
[52] U.S. Cl. ................................... 29/25.01; 118/725; 118/730; 437/925
[58] Field of Search ................ 437/925; 118/730, 725; 29/25.01

[56] References Cited

U.S. PATENT DOCUMENTS 3,845,738 11/1974 Berkman ........................... 118/725
4,499,354 2/1985 Hill et al. ........................... 118/725

FOREIGN PATENT DOCUMENTS 0174625 8/1986 Japan .................................. 437/925
0018618 1/1988 Japan .................................. 437/925

Primary Examiner—Olik Chaudhuri
Assistant Examiner—Ourmazd S. Ojan
Attorney, Agent, or Firm—Lorusso & Loud

[57] ABSTRACT

A susceptor for use in a vertical vapor growth apparatus includes a susceptor body (12) having an upper surface, a plurality of wafer receiving portions (17) formed in the upper surface of the susceptor body (12), and plates (16) fixed in the upper surface of the susceptor body (12) near the wafer setting portions (17). The plates (16) have an upper surface such that, when wafers (5) are mounted in the wafer setting portions (17), the upper surfaces of the plates (16) and the wafers (5) are positioned substantially in the same plane. The plates (16) are made of quartz glass or fused silica.

7 Claims, 2 Drawing Sheets

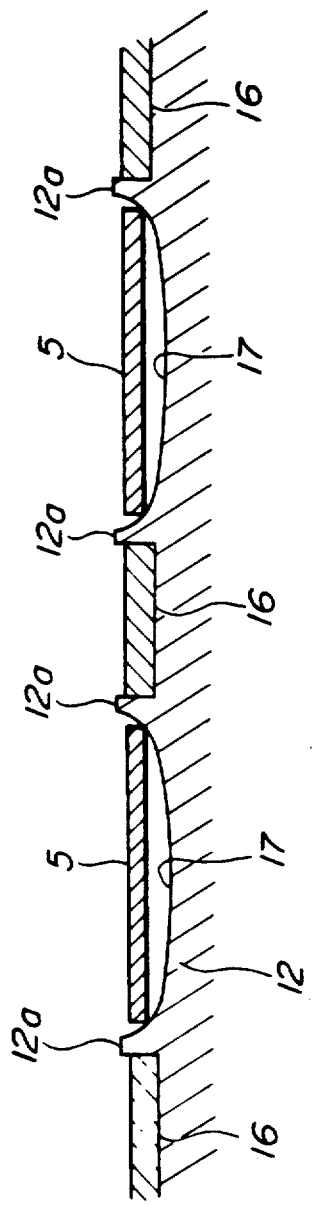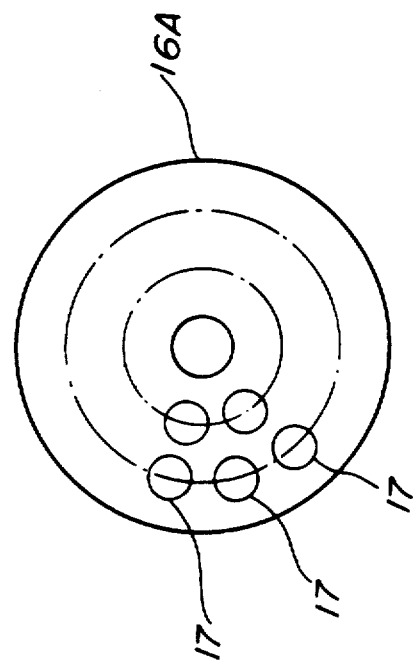

SUSCEPTOR

BACKGROUND OF THE INVENTION

This invention relates to an improved susceptor for use in a vertical vapor growth apparatus for producing semiconductor wafers.

PRIOR ART

Various vapor growth apparatuses have been publicly known in Japan, for example, as disclosed in Japanese Patent Laid-Open No. 60-160611.

A conventional vertical vapor growth apparatus includes a bell-jar type furnace made of quartz glass or stainless steel and a disc-shaped susceptor made of graphite and mounted in the furnace. A spiral high-frequency coil is placed under the susceptor so as to heat it. Plural wafers are positioned on the susceptor so as to be heated by the susceptor. A silicon epitaxial gas together with a carrier gas passes through the bell-jar furnace and flows over the upper side of the susceptor so as to come into contact with the wafers for vapor growth while the susceptor rotates about its center axis.

In the conventional susceptor, when the wafers are set on the upper surface of the susceptor, the upper surfaces of the wafers and the upper surface of the susceptor thus being positioned at different levels. Normally, the upper surfaces of the wafers are higher than the upper surface of the susceptor.

In such cases, as the upper surfaces of the wafers and the susceptor near the wafers form a step, the coating formed during the epitaxial growth step is apt to have a varied or irregular thickness. In particular, it is difficult to control precisely the coating thickness at the periphery of each wafer.

SUMMARY OF THE INVENTION

The object of this invention is to provide a susceptor for a vertical vapor growth apparatus in which the thickness of a coating formed on a wafer can be precisely controlled.

The susceptor for use in a vertical vapor growth apparatus, in accordance with the present invention, presents an upper surface substantially coplanar with the upper surfaces of the wafers supported thereon. Thus, the thickness of a semiconductor coating formed on each wafer can be precisely controlled in a uniform manner.

BRIEF DESCRIPTION OF THE DRAWINGS

FIG. 2 is a sectional view showing a further embodiment of this invention; and

FIG. 3 is a plan view showing a modified plate.

DESCRIPTION OF THE PREFERRED EMBODIMENTS

Figure 1:
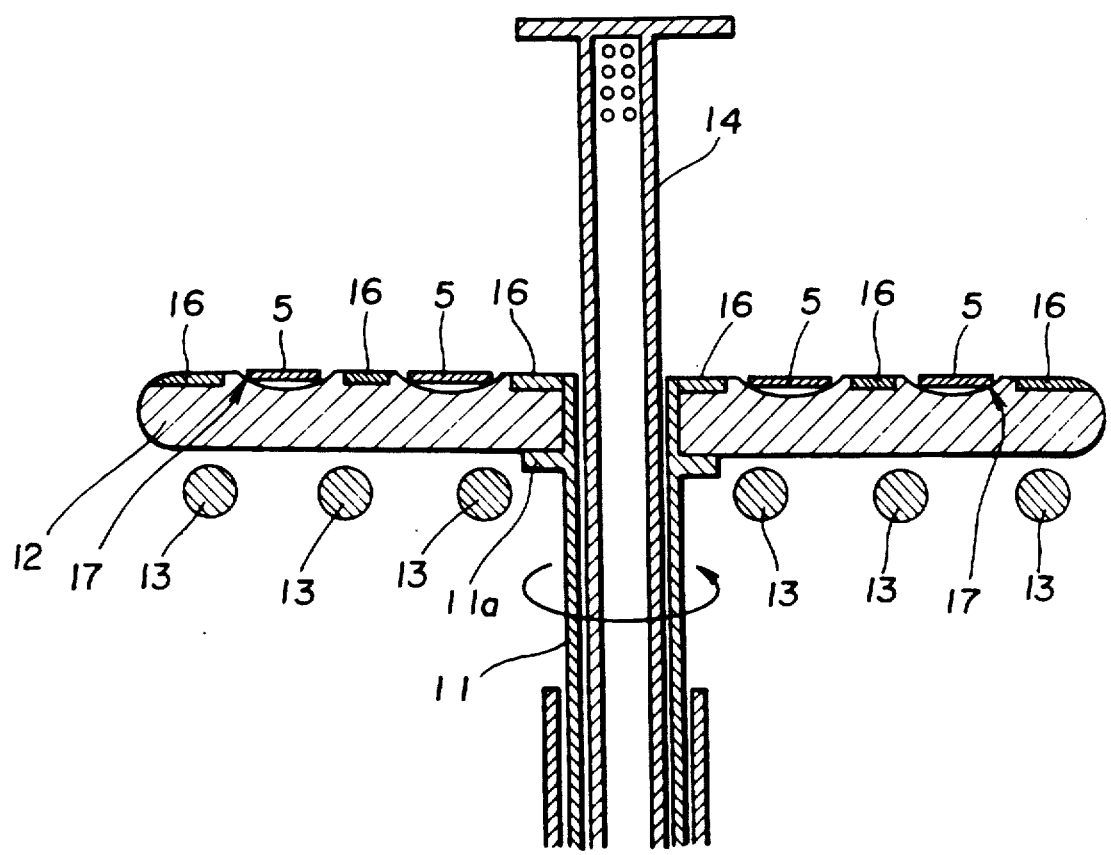
FIG. 1 is a vertical sectional view schematically showing a main portion of a vertical vapor growth apparatus according to this invention.

Referring to FIG. 1, a vertical vapor growth apparatus is shown including an improved susceptor 12. Except for the susceptor 12, the apparatus can have a conventional structure.

The susceptor 12 is made of a carbon base material and a SiC coating (not shown) finely formed thereon. The thickness of the SiC coating is 60 microns.

The SiC coating on the susceptor 12 can have any irregular thickness. For example, the upper surface of the susceptor can have a relatively thin SiC coating with a thickness of 60 microns while the lower surface of the susceptor can have a thick SiC coating with a thickness of 90 microns. Preferably, the coating thickness ratio of the upper surface to the longer surface is from 1.1 to 1.5.

The susceptor 12 has plural wafer receiving portions 17 on which wafers 5 are to be mounted as shown in FIG. 1. Each wafer receiving portion 17 is formed in the shape of a concave recess and circular in plan view. It also has a smooth surface. The wafer receiving portions 17 are arranged in two rows at regular intervals around the center axis of the susceptor 12. Plural quartz glass or fused silica plates 16 are placed near the wafer receiving portions 17. The plates 16 are embedded in the susceptor body 12. That is, recesses or grooves are formed in the upper surface of the susceptor 12, and then the plates 16 are fixed in the recesses or grooves. The plates 16 can be fixed to the susceptor body 12 by means of adhesives.

The quartz glass or fused silica plates 16 are stable for the wafers at an epitaxial growth temperature and have excellent chemical resistance against HCl gas used in cleaning a and a high purity.

The plates 16 are shaped and placed in such a manner that the upper surfaces of the wafers 5 and the upper surface of the susceptor 12 are positioned substantially at the same horizontal level if the wafers 5 are precisely mounted on the wafer receiving portions 17 as shown in FIG. 1. In such a condition, the upper surface of the susceptor 12 and the upper surfaces of all wafers 5 in the wafer receiving portions 17 are within the common horizontal plane.

If semiconductor crystals such as Si are formed on the plates 16, then they are removed by an etching method. Preferably, they are etched by means of HCl in each epitaxial growth cycle.

A support pipe 11 is arranged concentrically around a gas pipe 14. The whole of the support pipe 11 and at least its flange portion 11a has a base material made of sintered $Si_3N_4$ ceramic material or any other material having the same thermal expansion coefficient and a $Si_3N_4$ coating formed on the surface of the base material. The thickness of the $Si_3N_4$ coating is selected so as to prevent the impurities contained in the base material from being liberated.

The flange portion 11a of the support pipe 11 can be formed in any shape and is not limited to that illustrated one. For instance, in a modified mode of this invention, the flange portion 11a is not fixed to the support pipe 11 but can be adjusted at vertical positions along the support pipe as desired.

The susceptor 12 has a through-hole at its center the inner edge of which is supported by the flange portion 11a of the support pipe 11. The susceptor 12 can rotate together with the support pipe 11 in a conventional manner while it is maintained horizontal position. The gas pipe 14 is always held in a fixed and does not rotate.

A high-frequency coil 13 is arranged under the susceptor body 12 so as to heat it. The wafers 5 are mounted on the wafer receiving portions 17 on the upper side of the susceptor 12.

In operation, a silicon epitaxial gas passes through the gas pipe 14 and then blows on the wafers 5 by way of small openings formed in an upper portion of the gas pipe 14. Thus, the gas contacts the wafers 5 so as to accomplish a known vapor growth process.

Using to the vertical vapor growth apparatus of FIG. 1 an epitaxial coating growth process was performed to produce a coating having a thickness of 12 microns. As a result, the percentage of wafers having defective coatings was 0.5%. This test result was excellent in view of the fact that the percentage defectives was 30% using the prior art apparatus.

According to this invention, the thickness of wafer coatings can be precisely controlled in a uniform manner so as to increase yield.

This invention is not limited to the above-stated embodiments. For example, the susceptor body 12 can be mainly made of SiC.

FIG. 2 shows a further embodiment of this invention. The upper surface 12a of the susceptor body 12 is positioned slightly above the upper surfaces of the wafers 5 and the plates 16.

FIG. 3 shows a modified plate 16A made of quartz glass or fused silica which is a single circular plate having many hole-shaped wafer receiving portions 17 formed in two rows at regular intervals, although only five recesses 17 are shown in FIG. 3. A through hole is formed in the center of the plate 16A.

What is claimed is:

1. A susceptor for supporting a plurality of wafers for epitaxial crystal growth from vapor thereon, said susceptor comprising:

a main body portion presenting an upper surface for supporting the wafers thereon, said main body portion including a base and a SiC coating formed on said base and presenting said upper surface;

plate means embedded in said upper surface of said main body portion, said plate means defining a planar surface; and holding means, including a plurality of concave first recesses extending from said upper surface into said main body portion, for holding the wafers with their upper surfaces coplanar with said planar surface.

2. A susceptor as claimed in claim 1, wherein the plate means is is made of quartz glass.

3. A susceptor as claimed in claim 1, wherein the plate means is made of fused silica.

4. A susceptor as claimed in claim 1, wherein said upper surface of said main body portion and the upper surfaces of all wafers mounted in the holding means are within a common horizontal plane.

5. A susceptor as claimed in claim 1, wherein the plate means is a plurality of plates embedded in the susceptor body.

6. A susceptor as claimed in claim 1 wherein said holding means is a plurality of recesses formed in said upper surface of said main body portion.

7. A susceptor as claimed in claim 5 wherein said main body portion has a plurality of second recesses or grooves for receiving said plurality of plates.

* * * * *

UNITED STATES PATENT AND TRADEMARK OFFICE
CERTIFICATE OF CORRECTION

PATENT NO. : 5,074,017
DATED : December 24, 1991
INVENTOR(S) : TOYA et al

It is certified that error appears in the above-identified patent and that said Letters Patent is hereby corrected as shown below:

Col. 2, line 5, delete "longer" and insert --lower--;

line 10, after "and" insert --is--;

line 25, delete "a", first instance;

line 50, delete "one"; and line 59, delete "in a".

Signed and Sealed this

Twentieth Day of April, 1993

Attest:

MICHAEL K. KIRK

*Attesting Officer*   Acting Commissioner of Patents and Trademarks